United States Patent
Bauer et al.

(10) Patent No.: US 7,592,236 B2
(45) Date of Patent: Sep. 22, 2009

(54) METHOD FOR APPLYING A STRUCTURE OF JOINING MATERIAL TO THE BACK SURFACES OF SEMICONDUCTOR CHIPS

(75) Inventors: Michael Bauer, Nittendorf (DE); Ludwig Heitzer, Regensburg (DE); Jens Pohl, Bernhardswald (DE); Peter Strobel, Regensburg (DE); Christian Stuempfl, Schwandorf (DE)

(73) Assignee: Infineon Technologies AG, Neubiberg (DE)

( * ) Notice: Subject to any disclaimer, the term of this patent is extended or adjusted under 35 U.S.C. 154(b) by 125 days.

(21) Appl. No.: 11/582,551

(22) Filed: Oct. 18, 2006

(65) Prior Publication Data

US 2007/0087532 A1    Apr. 19, 2007

(30) Foreign Application Priority Data

Oct. 18, 2005   (DE) .................. 10 2005 050 127

(51) Int. Cl.
*H01L 21/00* (2006.01)
(52) U.S. Cl. .............. 438/460; 438/113; 438/462; 438/464; 257/E21.001
(58) Field of Classification Search ......... 438/113–114, 438/460, 462, 464; 257/E21.001
See application file for complete search history.

(56) References Cited

U.S. PATENT DOCUMENTS

| 6,562,658 | B2 * | 5/2003 | Ohuchi et al. ............. 438/113 |
| 6,579,748 | B1 * | 6/2003 | Okuno et al. .............. 438/124 |
| 6,686,225 | B2 * | 2/2004 | Wachtler .................... 438/114 |
| 6,828,175 | B2 * | 12/2004 | Wood et al. ................ 438/113 |
| 6,908,784 | B1 * | 6/2005 | Farnworth et al. ......... 438/106 |
| 7,060,532 | B2 * | 6/2006 | Takyu et al. ............... 438/114 |
| 7,064,010 | B2 * | 6/2006 | Farnworth et al. ......... 438/114 |
| 7,169,644 | B2 * | 1/2007 | Ferrari ...................... 438/113 |
| 7,176,572 | B2 * | 2/2007 | Hanaoka .................... 257/758 |
| 2002/0037631 | A1 | 3/2002 | Mimata |
| 2002/0048906 | A1 * | 4/2002 | Sakai et al. ................ 438/464 |
| 2003/0022465 | A1 | 1/2003 | Wachtler |
| 2003/0038355 | A1 | 2/2003 | Derderian |
| 2005/0098610 | A1 * | 5/2005 | Onobori et al. ......... 228/180.21 |

FOREIGN PATENT DOCUMENTS

GB         2404280 B      9/2006
WO    WO 2005/083779 A1   9/2005

* cited by examiner

*Primary Examiner*—Alexander G Ghyka
*Assistant Examiner*—Angel Roman
(74) *Attorney, Agent, or Firm*—Edell, Shapiro & Finnan, LLC

(57) ABSTRACT

A structure of joining material is applied to the back surfaces of semiconductor chips in manufacturing semiconductor devices. The joining material is applied, in finely metered and structured form via a joining material jet appliance, to the back surfaces of the semiconductor chips of a divided semiconductor wafer.

14 Claims, 4 Drawing Sheets

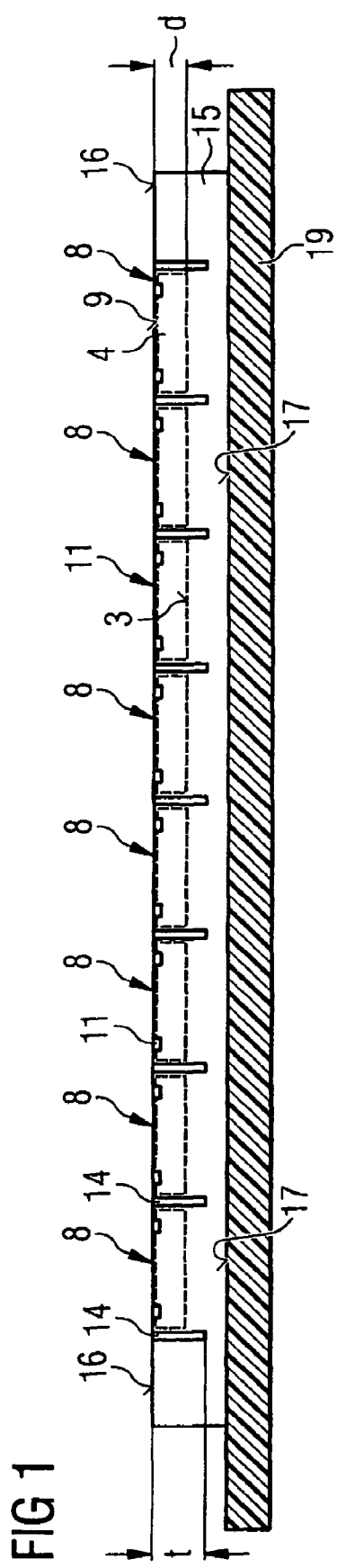
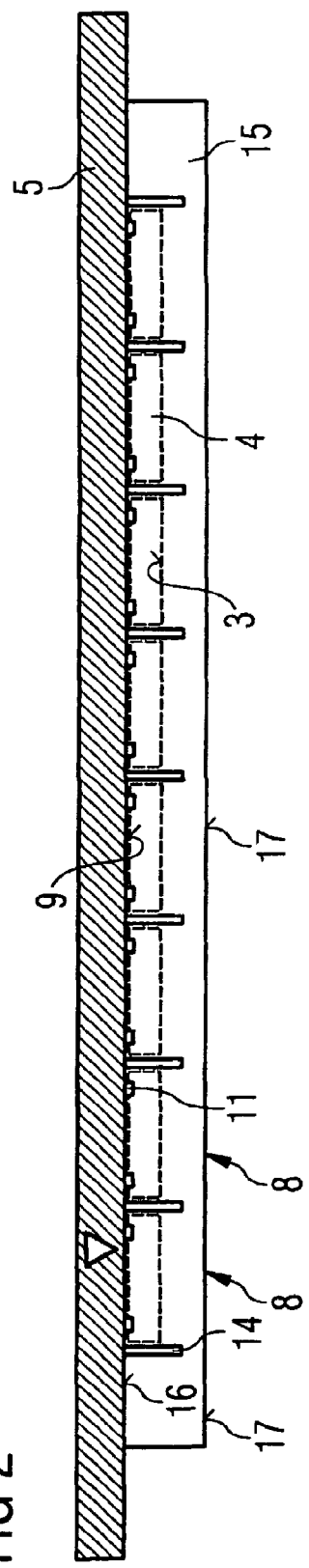

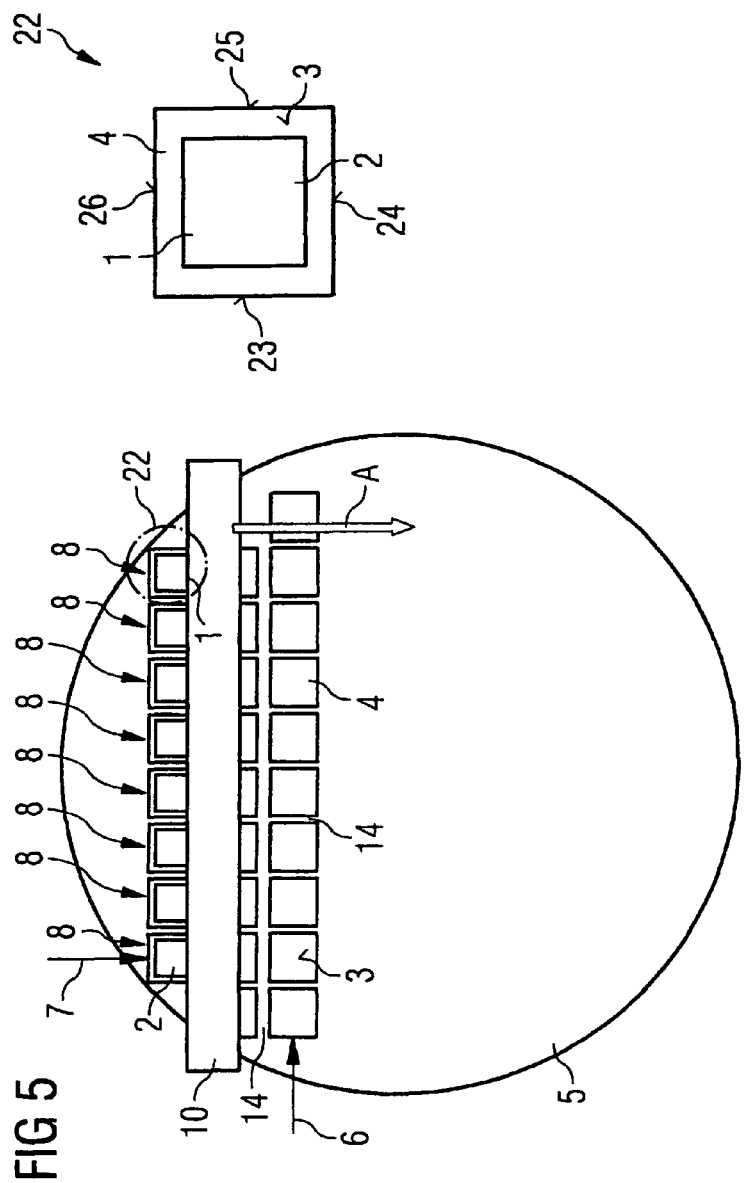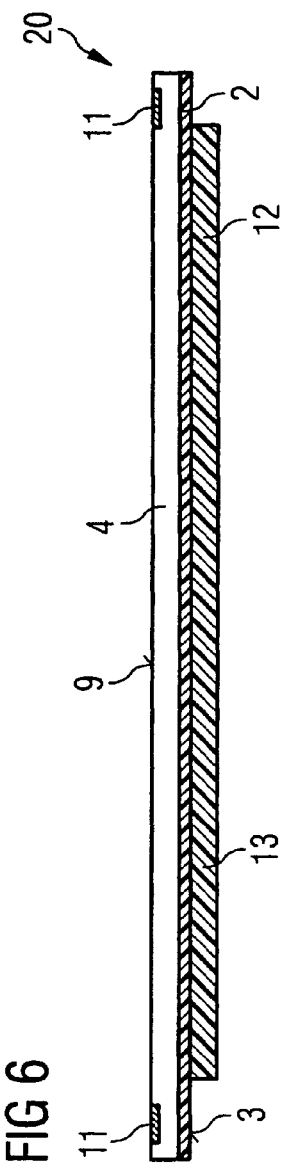

METHOD FOR APPLYING A STRUCTURE OF JOINING MATERIAL TO THE BACK SURFACES OF SEMICONDUCTOR CHIPS

CROSS REFERENCE TO RELATED APPLICATIONS

This application claims priority under 35 U.S.C. §119 to Application No. DE 102005050127.3 filed on Oct. 18, 2005, entitled "Method for Applying a Structure of Joining Material to the Back Surfaces of Semiconductor Chips," the entire contents of which are hereby incorporated by reference.

BACKGROUND

Thin semiconductor chips are becoming increasingly important. On one hand, the semiconductor chip thickness has a direct influence on the overall height of the encapsulated semiconductor device, and on the other hand thin semiconductor chips have a higher mechanical flexibility or a certain flexural elasticity. The production of thin semiconductor chips is therefore necessary in order to realize very thin semiconductor devices as part of miniaturization and to produce elastic semiconductor modules which are used, e.g., in chip cards.

The term "thin" according to the described device refers to wafers and/or semiconductor chips with a thickness of ≦150 μm, and in particular wafers and/or semiconductor chips with a thickness of ≦100 μm.

The production of thin semiconductor chips requires new types of production and working processes. To minimize handling of thin semiconductor chips or wafers during production, a known method has been developed allowing thin semiconductor chips to be produced from the thick, unground wafers without thin wafers having to be handled during the course of the process. In semiconductor assembly, this method is known as "dicing before grinding" (DBG).

In this known method, a first step requires the thick wafer to be sawn into from its top surface, i.e., the surface including the semiconductor chip structures, according to the thickness of the finished semiconductor chip. In a subsequent step, the top surface of the wafer which has been prepared in this way is applied to a protective sheet and then thinned from the back surface until the semiconductor chips are present in singulated form.

Mounting of the thin semiconductor chips requires a joining material between the semiconductor chips and a substrate. Separate application of the semiconductor chip and the joining material to the substrate involves drawbacks. A first drawback is that at least two method steps, namely the application of the joining material and the application of the semiconductor chip, are required. A second drawback is that both joining material and semiconductor chip each must be aligned on the substrate, which in practice requires complex setting of a plurality of modules with respect to one another.

In the present text, the term "substrate" is to be understood as meaning supports to which semiconductor chips are applied and which represent the external contacts for the installation of the fully encapsulated semiconductor device. A substrate in the context of the present method may include various materials, such as, e.g., ceramic, metals or an organic plastics material.

Methods are known for applying an adhesive sheet to the back surface of the semiconductor wafer, which has been thinned and divided into semiconductor chips, to act as the joining material. This technique has the drawback of requiring an additional dividing step in order to divide the sheet on the back surface of the semiconductor wafer which has been divided into semiconductor chips into individual sheets for each semiconductor chip. This in particular presents the risk of the semiconductor chips being contaminated with the sheet material. Moreover, the singulation of the sheet on the back surface of the semiconductor wafer which has been divided into semiconductor chips requires an additional procedure to apply the sheet to the back surface of the thinned and divided semiconductor wafer.

Methods are also known in which an adhesive sheet is applied to the back surface of the unthinned semiconductor wafer, and the silicon material and the adhesive sheet made from joining material are singulated simultaneously with the introduction of the dividing gaps for the individual semiconductor chips. This method has a first drawback in that there is a risk of contamination to the semiconductor material with the joining material. The second disadvantage is that the dividing tool is required to cut through two different materials at the same time, which is detrimental to the tool costs and service life of the dividing tool. A further drawback to the methods of the known art is that structuring of joining material on the back surfaces of the semiconductor chips is not possible. Therefore, the area of the joining material in each case corresponds to the entire area of the surface of the semiconductor chips.

SUMMARY

The method relates to applying a structure of joining material to the back surfaces of semiconductor chips in manufacturing semiconductor devices. The joining material is applied, in finely metered and structured form via a joining material jet appliance, to the back surfaces of the semiconductor chips of a divided semiconductor wafer.

The above and still further features and advantages of the method will become apparent upon consideration of the following definitions, descriptions and descriptive figures of specific embodiments thereof, wherein like reference numerals in the various figures are utilized to designate like components. While these descriptions go into specific details of the described method, it should be understood that variations may and do exist and would be apparent to those skilled in the art based on the descriptions herein.

BRIEF DESCRIPTION OF THE DRAWINGS

The method is explained in more detail below with reference to exemplary embodiments, where:

FIGS. 1 to 5 show procedures involved in producing semiconductor chips with joining material on the back surfaces;

FIG. 1 shows a diagrammatic cross section through a semiconductor wafer on a separating sheet following the introduction of separating gaps;

FIG. 2 shows a diagrammatic cross section through the semiconductor wafer from FIG. 1 after application to an intermediate support;

FIG. 3 shows a diagrammatic cross section through the semiconductor wafer of FIG. 2 after thinning of the back surface of the semiconductor wafer;

FIG. 4 shows a diagrammatic cross section through the semiconductor wafer from FIG. 3 which has been divided into semiconductor chips during application of joining material to the back surfaces of the semiconductor chips;

FIG. 5 shows a diagrammatic plan view of the semiconductor wafer from FIG. 4 during the application of joining material;

FIG. 6 shows a diagrammatic cross section through a semiconductor chip according to a second embodiment;

DETAILED DESCRIPTION

Figure 3:
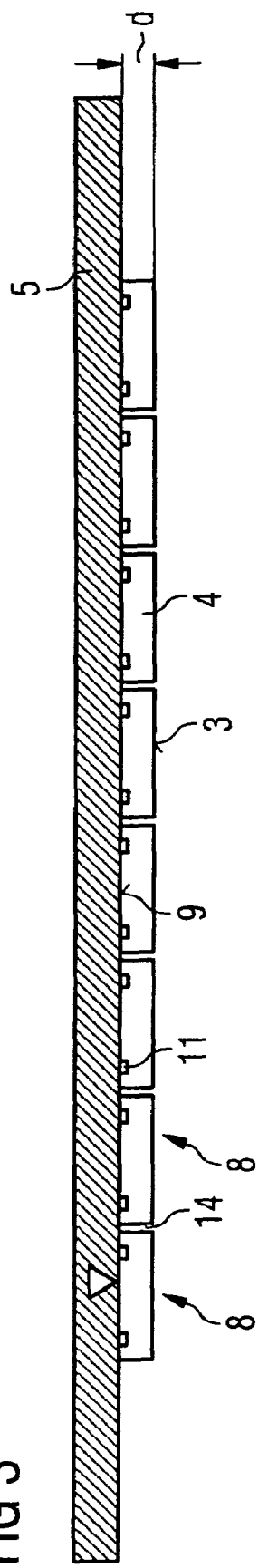

The method relates to applying a structure of joining material to the back surface of semiconductor chips for semiconductor device manufacture which allows structured application of a joining material to the back surface of the semiconductor chips of a semiconductor wafer which has been divided into semiconductor chips. The method includes: producing a semiconductor wafer with semiconductor chip positions arranged in rows and columns; dividing the semiconductor wafer into semiconductor chips, the wafer being on a separating sheet or dividing it into individual semiconductor chips using the DBG process; mounting the semiconductor wafer, which has been divided using the DBG process, or mounting the individual semiconductor chips on an intermediate support, the semiconductor chips being arranged in rows and columns in semiconductor device positions on the intermediate support, with the active top surfaces of the semiconductor chips being fixed on the intermediate support; and coating the back surfaces of the semiconductor chips with a structure of a joining material, the joining material being applied in finely metered and structured form using a joining material jet appliance. This method has, inter alia, the following advantages:

1. The semiconductor wafer or semiconductor chips are not touched during application of the joining material structure and are therefore also not mechanically stressed.
2. It is possible for both semiconductor wafers or semiconductor chips with standard thickness and "very thin" semiconductor wafers or semiconductor chips to be provided with the joining material.
3. There is no need for any special tools, as have to be used for example when dispensing the joining material onto the back surfaces of the semiconductor chips.
4. The joining material can be applied over the entire area or in any desired structure. This allows the patterns of the joining material on the back surface to be designed completely freely.
5. The layer thickness can be set as desired or applied in a controlled way.
6. The semiconductor chips coated with a joining material of this type, during the subsequent method, can be applied to a circuit substrate using a low contact pressure, since, on account of its high level of thickness accuracy and flatness, the joining material does not have to be leveled by a high contact pressure as in the dispensing method.
7. The joining material is advantageous, in particular for the DBG process, since the back surfaces of the thinned semiconductor chips of a wafer which has been divided into semiconductor chips are available after the thinning.
8. The risk of the edges or top surfaces of the semiconductor chips being contaminated with joining material is eliminated. Moreover, there is no damage to the semiconductor material in the region of the edges of the semiconductor chips.
9. The process of applying the semiconductor chips to a circuit substrate can be carried out in a shorter time.

A method for producing semiconductor devices with semiconductor chips which have back surfaces that have been coated using a joining material jet appliance comprises: feeding the semiconductor chips, which have been coated on their back surfaces using the joining material jet appliance as described in the above method, to an automated mounting device; lifting the semiconductor chips, in the automated mounting device, off the intermediate support; fixing the back surfaces, which have been coated with joining material, of the semiconductor chips in semiconductor device positions of a circuit substrate; connecting the contact faces on the top surfaces of the semiconductor chips to contact-connection faces of the circuit substrate via connecting elements in the semiconductor device positions; packaging the semiconductor chips, the connecting elements and at least part of the circuit substrate in a plastic encapsulation compound; and dividing the circuit substrate into individual semiconductor devices.

This method has the advantage that it is possible for a plurality of semiconductor devices to be produced simultaneously on the circuit substrate. It also has the advantage of allowing a relatively low component height to be achieved, especially since this method can be carried out using thinned semiconductor chips. Finally, the scrap rate is low, since the fixing on the circuit carrier requires only minimal forces to be applied to the semiconductor chip.

In a preferred implementation example of the method, a second joining material is applied to the semiconductor chips in a structured manner, via a joining material jet, to form spacers and/or as a compensation layer to compensate for distortion of a semiconductor chip. This makes it possible for a plurality of semiconductor chips to be stacked on top of one another to form semiconductor stacks, with the spacers of the second structured joining material being inserted, such that when the semiconductor chips are being placed on top of one another they can be held at a predetermined distance by the spacers in an advantageous way.

In a further implementation example of the method, the semiconductor wafer is thinned before the semiconductor wafer is divided into semiconductor chips, by first of all introducing separating gaps from the top surface of the semiconductor wafer, which gaps do not completely sever the semiconductor wafer. Then, the top surface of the semiconductor wafer is fixed on an intermediate support and thinned from the back surface until the separating gaps are reached. The joining material can be applied by means of a joining material jet in accordance with the method described above. In this context, it is advantageous for the joining material, after it has been applied, to be brought into the so-called B state, i.e., to carry out primarily crosslinking of the joining material, in order to facilitate the subsequent method steps and further processing.

In the following paragraphs, exemplary embodiments of the method are described in connection with the figures.

FIG. 1 shows a diagrammatic cross section through a semiconductor wafer 15 arranged on a separating sheet 19 after introduction of separating gaps 14. For this purpose, the back surface 17 of the semiconductor wafer 15 is fixed on the separating sheet 19. Subsequently, separating gaps 14 are introduced from the top surface 16 of the semiconductor wafer 15 to a depth t which is such that the separating gaps 14 do not completely sever the semiconductor wafer 15, but this depth t is at least greater than the thickness d of the thinned semiconductor chips 4. The cross section of these semiconductor chips 4 is marked by dotted lines in FIG. 1.

The separating gaps 14 are introduced along semiconductor device positions 8 which are arranged in rows and columns on the semiconductor wafer 15. Contact faces 11, which are connected via interconnects to corresponding integrated circuit structures with the near-surface regions of the semiconductor chips 4 are arranged on the active top surfaces 9 of the semiconductor chips 4. After the separating gaps 14 have been introduced, an intermediate support, which protects the top surfaces 9 of the semiconductor chips 4, is applied to the top surface 16 of the semiconductor wafer 15.

FIG. 2 shows a diagrammatic cross section through the semiconductor wafer 15 from FIG. 1 after application to the intermediate support 5. As a result of the intermediate support 5 being applied to the top surface 16 of the semiconductor wafer 15 and the separating sheet 19 being removed, the back surface 17 of the semiconductor wafer 15 becomes accessible for the subsequent step of thinning the semiconductor wafer 15.

FIG. 3 shows a diagrammatic cross section through the semiconductor wafer from FIG. 2 after thinning of the back surface of the semiconductor wafer. This thinning of the semiconductor wafer is continued until the final thickness d of the semiconductor chips 4 has been reached and therefore the semiconductor wafer on the intermediate support 5 has been divided into semiconductor chips 4. As a result, the back surfaces 3 of the semiconductor chips 4 are exposed.

Figure 4:
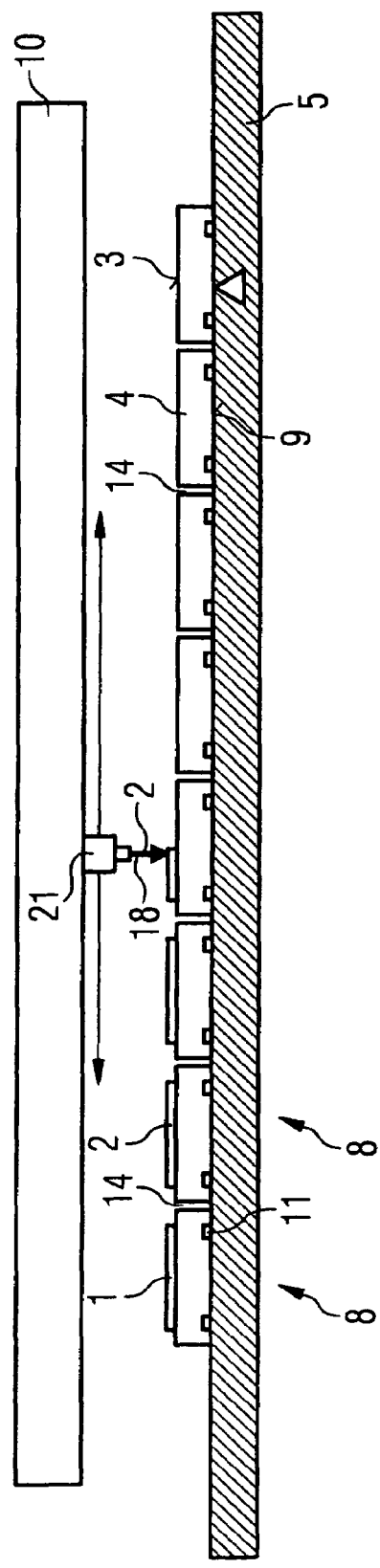

FIG. 4 shows a diagrammatic cross section through the semiconductor wafer from FIG. 3 which has been divided into semiconductor chips 4 and the application of joining material 2 to the back surfaces 3 of the semiconductor chips 4. The joining material 2 is applied via a joining material jet appliance 10, in which a series of joining jet nozzles in a joining material nozzle head 21 generate joining material jets 18 which provide the back surfaces 3 of the semiconductor chips 4 with joining material 2, e.g., such as in a manner similar to that of an ink-jet printer. An accurately applied structure 1 of joining material 2 is in this way formed on the back surfaces 3 of the semiconductor chips 4.

FIG. 5 shows a diagrammatic plan view of the intermediate support 5 from FIG. 4 during application of joining material 2. The semiconductor chips 4 are arranged on the intermediate support 5 in rows 6 and columns 7 in semiconductor device positions 8. This illustration shows only three rows of the semiconductor device positions 8, in order to simplify the drawing. It is typical for the entire intermediate support 5 to be covered with corresponding semiconductor chip positions 8. A joining material jet appliance 10 is guided over the semiconductor chip positions 8 of the intermediate support 5, for example, moving in the direction indicated by arrow A. The joining material 2 is applied in structured form to the back surfaces 3 of the semiconductor chips 4.

The structure 1 is illustrated on a large scale in excerpt 22, with the structure 1 of the joining material 2 in this embodiment of the invention being set in such a manner that the area of the joining material 2 is smaller than the area of the back surface 3 of the semiconductor chip 4. This ensures that the edges 23 to 26 of the semiconductor chip 4 remain completely free of any contamination with joining material. This also obviates the procedure of dividing the joining material, which is otherwise necessary when a joining material sheet is applied. Finally, during this application, the semiconductor chips do not have to be touched, unlike when applying joining material sheets. Also, there is no dividing of sheets to endanger the sensitive edges 23 to 26 of the semiconductor chip 4.

In this way, very thin semiconductor chips 4 can be coated with joining material 2 on the back surface 3. In addition to the simple square structure of the joining material 2 shown here, it is possible to produce any desired designs of joining material structures 1. The high writing speed of joining material jet appliances 10 of this type allows rapid and touchless application of the joining material 2 in suitable structure area shapes. In addition, the layer thickness of the joining material can be set via the speed at which the joining material jet appliance 10 is moved over the back surfaces of the semiconductor chips 4 in the direction of arrow A. Moreover, the flatness of the applied joining material coating is so high that there is no need for high contact pressures for the semiconductor chips 4 to be applied to a circuit substrate, since the joining material 2 does not have to be leveled by a suitably high contact pressure, as is the case when using a dispensing method.

Alternatively, it is also possible for semiconductor chips 4 with a normal thickness and with their top surfaces arranged on an intermediate support 5 to be provided on their back surfaces 3 with corresponding structures 1 of a joining material 2 and/or to be provided with a spacer 13 made from joining material, in order to allow the possibility of stacking semiconductor chips 4 to form a semiconductor chip stack.

FIG. 6 shows a diagrammatic cross section through a semiconductor chip 20 according to a second embodiment of the invention. In this embodiment of the invention, two joining materials 2 and 12 have been applied to the back surface 3 of the semiconductor chip 4, with the second joining material 12 forming a spacer 13 which is suitable for effecting stacking of semiconductor chips 4 while leaving exposed contact faces 11 of the semiconductor chip 20.

Figure 7:
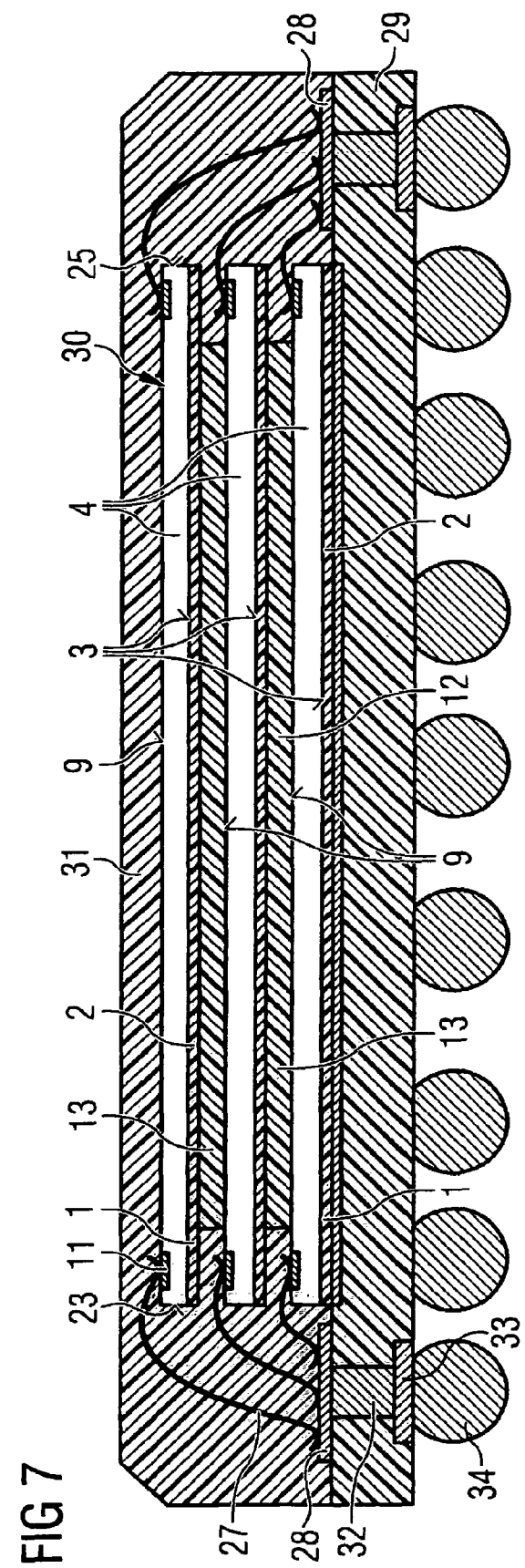
FIG. 7 shows a semiconductor device of a third embodiment with a semiconductor chip stack.

FIG. 7 shows by way of example a semiconductor chip stack 30 of this type with corresponding bonding connection elements 27 electrically connecting the contact faces 11 to contact-connection faces 28 on a circuit substrate 29. The semiconductor chip stack 30, the bonding connection elements 27 and parts of the circuit substrate 29 are embedded in a plastic encapsulation compound 31. Through-contacts 32 lead through the circuit substrate 29 to outer contact faces 33, which bear outer contacts 34, such that the outer contacts 34 are electrically connected to the contact faces 11 of the stacked semiconductor chips 4.

While the method has been described in detail with reference to specific embodiments thereof, it will be apparent to one of ordinary skill in the art that various changes and modifications can be made therein without departing from the spirit and scope thereof. Accordingly, it is intended that the described method covers the modifications and variations of this method provided they come within the scope of the appended claims and their equivalents.

What is claimed is:

1. A method for applying a structure of joining material to a back surface of semiconductor chips in semiconductor device manufacture, the method comprising:
   a) producing a semiconductor wafer including semiconductor chip positions arranged in rows and columns;
   b) dividing the semiconductor wafer into a plurality of semiconductor chips;
   c) mounting active top surfaces of the semiconductor chips on an intermediate support such that the semiconductor chips are arranged in rows and/or columns on semiconductor device positions; and
   d) coating back surfaces of the plurality of divided semiconductor chips with a structure of a joining material, the joining material being applied in structured and finely metered form via a joining material jet appliance such that side faces of the semiconductor chips remain exposed.

2. The method according to claim 1, wherein b) includes dividing the semiconductor wafer into semiconductor chips on a separation sheet.

3. The method according to claim 1, wherein b) includes dividing the semiconductor wafer into semiconductor chips via a dicing before grinding (DBG) process.

4. The method as claimed in claim 1, further comprising:
   e) applying a second joining material to the semiconductor chips in a structured manner, via a joining material jet appliance, thereby forming spacers and/or compensation layers that compensate for distortion of a semiconductor chip.

5. The method as claimed in claim 4, further comprising:
f) stacking a plurality of semiconductor chips on top of one another, the semiconductor chips being separated via the spacers of the second structured joining material, thereby forming a semiconductor chip stack.

6. The method as claimed in claim 1, wherein b) comprises:
introducing separating gaps, that do not completely sever the semiconductor wafer, into the top surface of the semiconductor wafer;
fixing a top surface of the semiconductor wafer on an intermediate support; and
thinning the semiconductor wafer from the back surface until the separating gaps are reached, thereby dividing the semiconductor wafer into semiconductor chips.

7. The method as claimed in claim 1, wherein the joining material is applied such that areas of the joining material are smaller than areas of the back surfaces.

8. A method for fabricating semiconductor devices with semiconductor chips including back surfaces coated with a joining material via a joining material jet appliance, the method comprising:
 a) feeding semiconductor chips, that include back surfaces coated with a structure of joining material with a structured and finely metered form via a joining material jet appliance, to an automated mounting device;
 b) lifting the semiconductor chips off the intermediate support,
 c) fixing the back surfaces of the semiconductor chips in semiconductor device positions of a circuit substrate;
 d) connecting contact faces, on the top surfaces of the semiconductor chips, to contact-connection faces of the circuit substrate via connecting elements in the semiconductor device positions;
 e) packaging the semiconductor chips, the connecting elements and at least part of the circuit substrate in a plastic encapsulation compound; and
 f) dividing the circuit substrate into individual semiconductor devices.

9. The method as claimed in claim 8, wherein the semiconductor chips further include a second joining material, that is applied in a structured manner via a joining material jet appliance, thereby forming spacers and/or compensation layers that compensate for distortion of a semiconductor chip.

10. The method as claimed in claim 9, further comprising:
 g) stacking a plurality of semiconductor chips on top of one another, the semiconductor chips being separated via the spacers of the second structured joining material, thereby forming a semiconductor chip stack.

11. The method as claimed in claim 8, wherein the joining material coats the back surfaces such that areas of the joining material are smaller than areas of the back surfaces.

12. The method as claimed in claim 8, wherein a) further comprises:
 a.1) producing a semiconductor wafer including semiconductor chip positions arranged in rows and columns;
 a.2) dividing the semiconductor wafer into a plurality of semiconductor chips;
 a.3) mounting active top surfaces of the semiconductor chips on an intermediate support such that the semiconductor chips are arranged in rows and/or columns on semiconductor device positions; and
 a.4) coating back surfaces of the plurality of divided semiconductor chips with a structure of a joining material, the joining material being applied in structured and finely metered form via a joining material jet appliance such that side faces of the semiconductor chips remain exposed.

13. The method according to claim 12, wherein a.2) includes dividing the semiconductor wafer into semiconductor chips on a separation sheet.

14. The method according to claim 12, wherein a.2) includes dividing the semiconductor wafer into semiconductor chips via a dicing before grinding (DBG) process.

* * * * *